(12) United States Patent
Miks et al.

(10) Patent No.: US 7,074,654 B1
(45) Date of Patent: Jul. 11, 2006

(54) TAPE SUPPORTED MEMORY CARD LEADFRAME STRUCTURE

(75) Inventors: Jeffrey A. Miks, Chandler, AZ (US); Curtis M. Zwenger, Chandler, AZ (US); Maximilien d'Estries, Mesa, AZ (US); Stephen G. Shermer, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 172 days.

(21) Appl. No.: 10/828,616

(22) Filed: Apr. 21, 2004

(51) Int. Cl.
*H01L 21/44* (2006.01)

(52) U.S. Cl. ...................... 438/123; 257/670

(58) Field of Classification Search ........... 438/123; 257/670
See application file for complete search history.

(56) References Cited

U.S. PATENT DOCUMENTS

| | | | |
|---|---|---|---|
| 3,668,299 A | 6/1972 | McNeal | |
| 4,532,419 A | 7/1985 | Takeda | |
| 4,905,124 A | 2/1990 | Banjo et al. | |
| 4,974,120 A | 11/1990 | Kodai et al. | |
| 5,172,214 A | 12/1992 | Casto | |
| 5,360,992 A | 11/1994 | Lowrey et al. | |
| 5,574,309 A | 11/1996 | Papapietro et al. | |
| 5,742,479 A | 4/1998 | Asakura | |
| 5,753,532 A | 5/1998 | Sim | |
| 5,784,259 A | 7/1998 | Asakura | |
| 5,822,190 A | 10/1998 | Iwasaki | |
| 5,977,613 A | 11/1999 | Takata et al. | |
| 6,040,622 A | 3/2000 | Wallace | |
| 6,143,981 A | 11/2000 | Glenn | |
| 6,249,042 B1 * | 6/2001 | Sato et al. | 257/666 |
| D445,096 S | 7/2001 | Wallace | |
| D446,525 S | 8/2001 | Okamoto et al. | |
| 6,384,472 B1 | 5/2002 | Huang | |
| 6,476,469 B1 | 11/2002 | Hung et al. | |
| 6,545,332 B1 | 4/2003 | Huang | |
| 6,603,196 B1 | 8/2003 | Lee et al. | |
| 6,624,005 B1 | 9/2003 | DiCaprio et al. | |
| 2002/0140068 A1 | 10/2002 | Lee | |
| 2004/0104457 A1 * | 6/2004 | Tan et al. | 257/666 |

FOREIGN PATENT DOCUMENTS

| | | |
|---|---|---|
| JP | 3112688 | 5/1991 |
| JP | 7017175 | 1/1995 |
| JP | 8190615 | 7/1996 |
| JP | 10334205 | 12/1998 |

* cited by examiner

*Primary Examiner*—Carl Whitehead, Jr.
*Assistant Examiner*—Colleen E. Rodgers
(74) *Attorney, Agent, or Firm*—Stetina Brunda Garred & Brucker

(57) ABSTRACT

A method of fabricating a memory card. The method comprises the initial step of providing a leadframe which has a dambar and a plurality of contacts, each of the contacts being attached to the dambar by at least one tie bar. A layer of tape is applied to the leadframe such that the tape covers at least portions of the top contact surfaces of the contacts, at least portions of the top tie bar surfaces of the tie bars, and at least a portion of the top dambar surface of the dambar. Thereafter, the tie bars are removed from the leadframe. At least one semiconductor die is then electrically connected to the leadframe, with a body thereafter being formed on the leadframe such that the semiconductor die and the tape are covered by the body and the bottom contact surfaces are exposed in an exterior surface thereof.

15 Claims, 8 Drawing Sheets

TAPE SUPPORTED MEMORY CARD LEADFRAME STRUCTURE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates generally to memory cards, and more particularly, to a memory card (e.g., a multi-media card (MMC)) wherein tape or an epoxy is used to support the external signal contacts (ESC's) of the memory card leadframe structure so that the tie bars used to connect the contacts to the outer frame of the leadframe can be removed prior to the molding of the package body of the memory card.

As is well known in the electronics industry, memory cards are being used in increasing numbers to provide memory storage and other electronic functions for devices such as digital cameras, MP3 players, cellular phones, and Personal Digital Assistants. In this regard, memory cards are provided in various formats, including multi-media cards and secure digital cards.

Typically, memory cards comprise multiple integrated circuit devices or semiconductor dies. The dies are interconnected using a circuit board substrate which adds to the weight, thickness, stiffness and complexity of the card. Memory cards also include electrical contacts for providing an external interface to an insertion point or socket. These electrical contacts are typically disposed on the backside of the circuit board substrate, with the electrical connection to the dies being provided by vias which extend through the circuit board substrate.

In an effort to simplify the process steps needed to fabricate the memory card, there has been developed by Applicant a memory card wherein a leadframe assembly is used as an alternative to the circuit board substrate, as described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001, the disclosure of which is incorporated herein by reference. As is described in Ser. No. 09/956,190, the leadframe and semiconductor die of the memory card are covered with an encapsulant which hardens into a cover or body of the memory card. The body is sized and configured to meet or achieve a "form factor" for the memory card. In the completed memory card, the contacts of the leadframe are exposed within a common surface of the body, with the die pad of the leadframe and the semiconductor die mounted thereto being disposed within or covered by the body.

Memory cards, such as multi-media cards, are used by advancing the same into a host socket which includes a plurality of connector pins. Many host sockets include nine connector pins to accommodate the seven contacts included in many memory card formats such as multi-media cards, and the nine contacts included in the secure digital card memory card format. Applicant has previously determined that one of the drawbacks associated with leadframe based memory cards is that portions of the tie bars which are used to connect the contacts to the outer frame of the leadframe are typically exposed in the leading edge of the memory card which is initially advanced into the host socket. More particularly, exposed within this leading edge are the severed ends of the tie bars created as a result of the cutting or singulation process typically used to separate the outer frame of the leadframe from the remainder thereof subsequent to the formation of the body of the memory card. These exposed portions of the tie bars give rise to a potential to short against the metal features of the host socket, and are thus highly undesirable.

The present invention addresses and overcomes the above-described deficiencies of currently known leadframe based memory cards by providing a memory card wherein tape or an epoxy is used to support the contacts of the memory card leadframe structure so that the tie bars used to secure the contacts to the outer frame can be removed prior to the molding of the body of the memory card. More particularly, the tape or epoxy is applied to the leadframe, with the tie bars thereafter being punched out or otherwise removed, thus leaving the tape or epoxy to hold the contacts of the leadframe structure in place during the remaining steps of the assembly process. These and other attributes of the present invention will be described in more detail below.

BRIEF SUMMARY OF THE INVENTION

In accordance with the present invention, there is provided a method for manufacturing a memory card such as a multi-media card wherein one or more layers of tape is applied to a leadframe for purposes of supporting the contacts of the leadframe in a manner allowing for the removal of the tie bars of the leaframe used to support the contacts within the dambar thereof. More particularly, tape is used to support the ESC pads or contacts of the leadframe structure so that the contact supporting tie bars can be removed prior to the molding of the body of the memory card. More particularly, tape is applied to the top and/or bottom surfaces of the leadframe, with the tie bars thereafter being punched out or otherwise removed from the leadframe, thus leaving the tape to hold the contacts of the leadframe structure in place during further assembly processing steps.

As a result of the complete removal of the tie bars attaching the contacts of the leadframe to the dambar thereof, the completely formed memory card does not include any tie bar ends exposed in the leading edge thereof. In this regard, the absence of the exposed ends of the tie bars in the leading edge of the memory card eliminates the potential for the tie bars shorting against the metal features of the host socket into which the memory card is to be inserted.

In accordance with alternative embodiments of the present invention, there is also provided a manufacturing method for a memory card wherein the leadframe is not provided with contact supporting tie bars at all, the contacts being supported within the interior of the dambar of the leadframe via a layer of tape. In this embodiment, a two-step molding operation is completed to form the body of the memory card, such body including radiused edges or corners which extend around the entire perimeter of the memory card, and also being devoid of any exposed tie bars. In yet another alternative embodiment of the present invention, the leading edge or side of the memory card is subjected to a milling or etching process which effectively contours the same such that the exposed ends of the contact supporting tie bars will not engage any metal features of the host socket.

The present invention is best understood by reference to the following detailed description when read in conjunction with the accompanying drawings

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
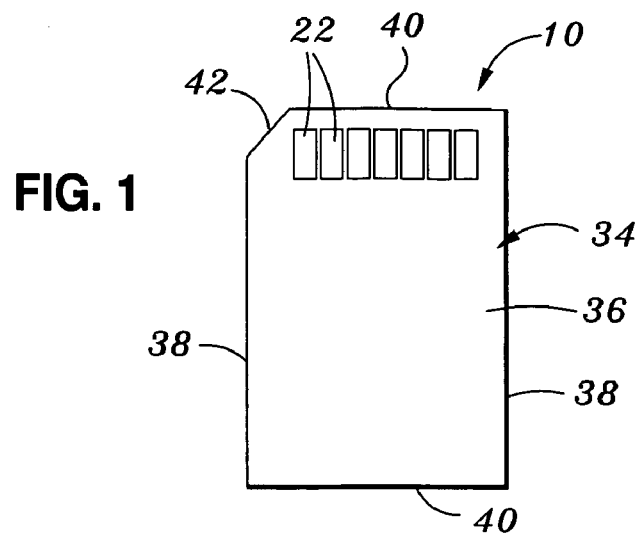
FIG. 1 is a bottom plan view of a memory card fabricated through the use of a tape supported leadframe in accordance with the present invention.
Figure 2:
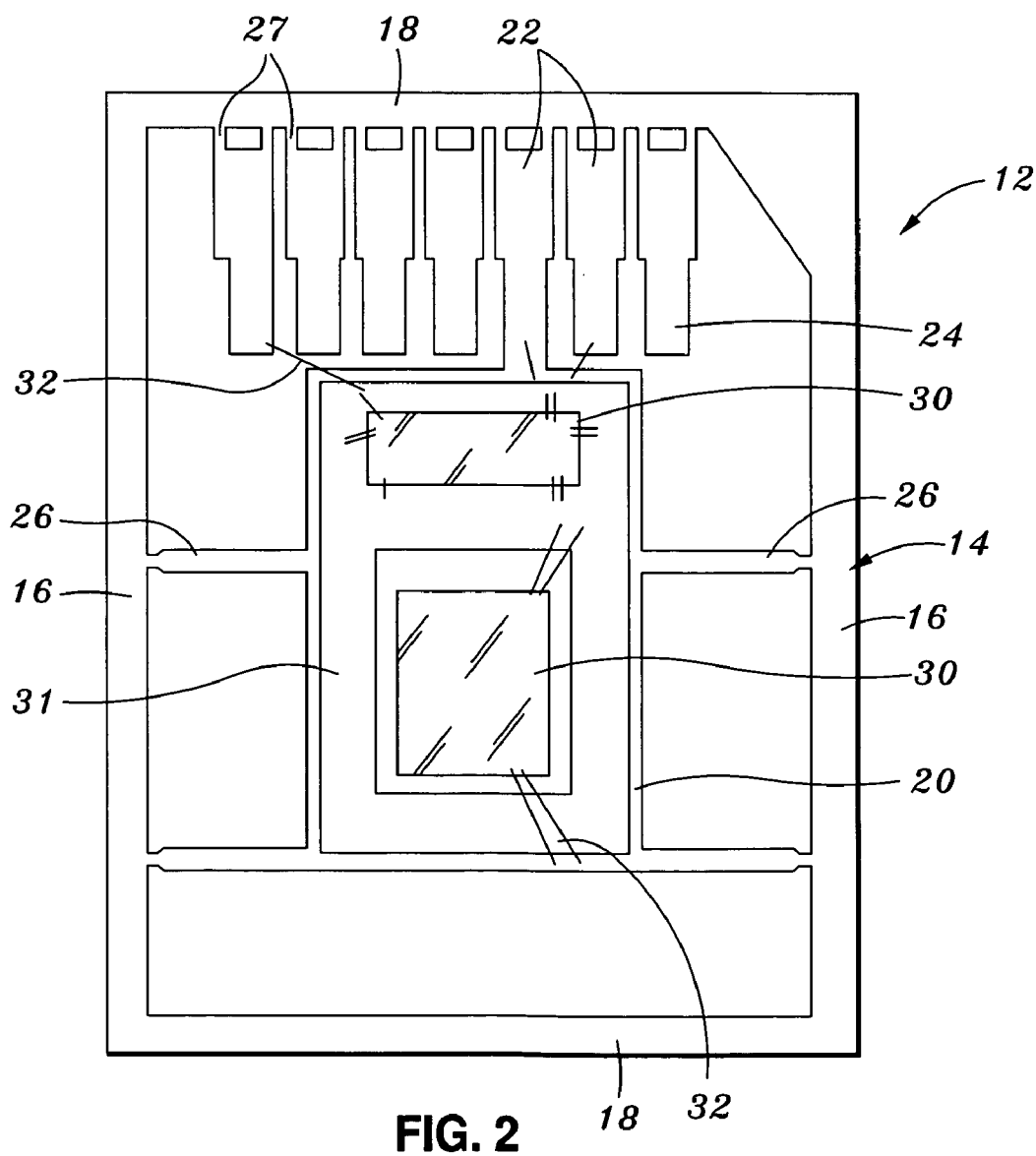
FIG. 2 is a top plan view of the leadframe of the memory card shown in FIG. 1 prior to the application of the tape thereto.

Referring now to the drawings wherein the showings are for purposes of illustrating preferred embodiments of the present invention only, and not for purposes of limiting the same, FIG. 1 depicts a memory card 10 which includes a leadframe 12 best shown in FIG. 2. As shown in FIG. 1, the memory card 10 has a form factor particularly suited for use in a multi-media card memory application. However, those of ordinary skill in the art will recognize that the memory card 10 may have alternative memory card formats, including those of secure digital cards (SDC), compact flash (CF), smart media, memory stick, and other small form factor memory cards.

The leadframe 12 of the memory card 10 comprises an outer frame or dambar 14 which is eventually removed from the leadframe 12 as described below, and thus does not constitute part of the completed memory card 10. Dambar 14 has a generally rectangular configuration defining an opposed pair of longitudinal sides or segments 16 and an opposed pair of lateral sides or segments 18. In addition to the dambar 14, the leadframe 12 includes a die attach area or die pad 20 which is disposed within the interior of the dambar 14. Die pad 20 defines opposed, generally planar top and bottom surfaces. Integrally connected to and extending from one lateral side 18 of the dambar 14 is a plurality of contacts 22 of the leadframe 12. Each of the contacts 22 also defines opposed, generally planar top and bottom surfaces. Integrally connected to and extending from each of the contacts 22 is a conductive trace 24. The traces 24 terminate in close proximity to the die pad 20. Tie bars 26 are used to integrally connect the die pad 20 to the longitudinal sides 16 of the dambar 14. Similarly, one or more tie bars 27 are used to integrally connect the contacts 22 to one lateral side 18 of the dambar 14. In particular, as is seen in FIG. 2, two tie bars 27 are integrally connected to and extend between each contact 22 and the corresponding lateral side 18, though one or more than two tie bars 27 may be used to facilitate such connection.

In the memory card 10, attached to the top surface of the die pad 20 are multiple semiconductor dies 30. In FIG. 2, a pair of semiconductor dies 30 is shown as being attached and electrically connected to a common interposer or laminate substrate 31, which is in turn attached to the top surface of the die pad 20. The semiconductor dies 30 and/or the substrate 31 are electrically connected to the leadframe 12, and more particularly to one or more traces 24, the die pad 20, and/or each other through the use of conductive wires 32. In this regard, the conductive wires 32 effectively place the semiconductor dies 30 into electrical communication with the leadframe 12 and, more particularly, to one or more of the contacts 22 thereof.

The leadframe 12 is preferably fabricated from a conductive metal material (e.g., copper) through either a chemical etching or mechanical stamping process. Those of ordinary skill in the art will recognize that the leadframe 12 may be formed to include any number of contacts 22 depending on the desired application for the memory card 10. As shown in FIG. 1, the memory card 10 includes seven contacts 22 which is the typical number included for a multi-media card application. The leadframe 12 may further be alternatively configured to define more than one die pad, with the die pad(s) accommodating one or more semiconductor dies alone or in combination with other devices such as passive devices. Additionally, the two semiconductor dies 30 shown in FIG. 2 may be attached directly to the die pad 20 as opposed to the intervening substrate 31. Further, the two semiconductor dies 30 shown in FIG. 2 may be substituted with one or more than two semiconductor dies alone or in combination with one or more other devices. Still further, one or more than two semiconductor dies and/or one or more other devices can be attached to a single die pad, or to respective ones of multiple dies pads, such semiconductor die(s) and/or other device(s) being attached either directly to the die pad(s) or to one or more intervening substrates. The pattern of conductive traces 24 may also be varied depending upon the number and arrangement of die pads and the number of semiconductor dies and/or other passive devices included in the memory card 10. Thus, the configuration of the leadframe 12 of the memory card 10 is variable, in that the number and arrangement of die pads, contacts, and conductive traces may be varied as needed to satisfy the requirements of a particular application. Along these lines, the number and arrangement of the semiconductor dies 30 shown in FIG. 2 is also exemplary only in that such number and arrangement may also be varied based on specific application requirements.

Figure 3A:
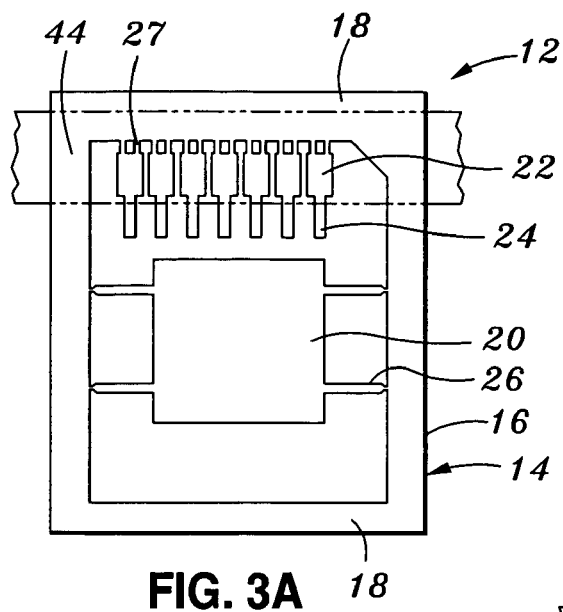
FIGS. 3A and 3B are top plan views of the leadframe of the memory card illustrating an exemplary sequence of steps which may be used to facilitate the application of tape thereto and the singulation of the tie bars thereof in accordance with a first embodiment of the present invention.
Figure 3B:
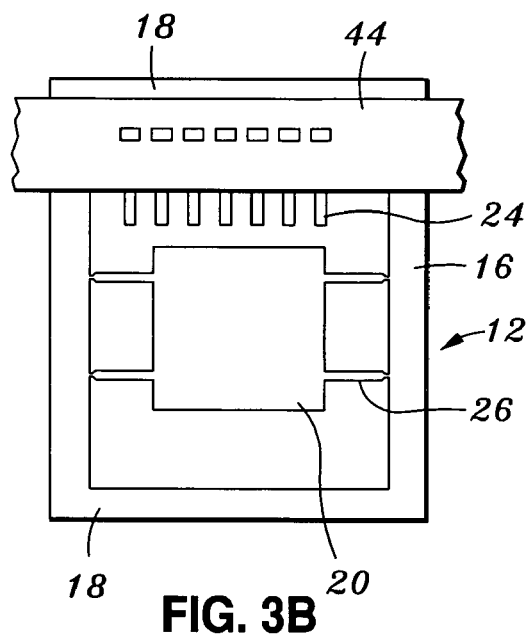
Figure 4:
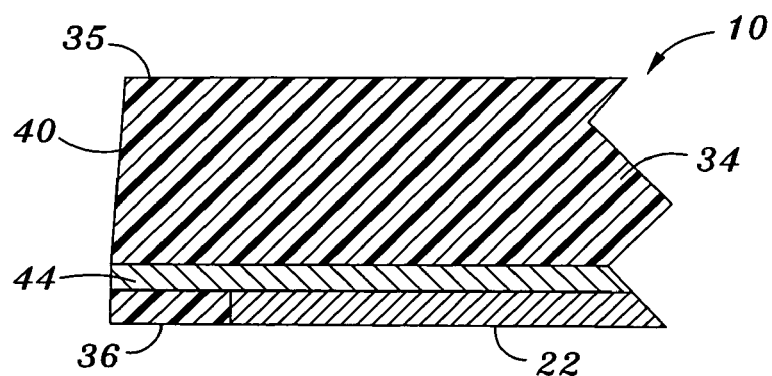
FIG. 4 is a partial cross-sectional view of a memory card formed through the implementation of the fabrication steps shown in FIGS. 3A and 3B.

Referring now to FIGS. 3A, 3B and 4, in accordance with a first embodiment of the present invention, the memory card 10 is fabricated by initially forming the leadframe 12 to have the above-described structural attributes. Thereafter, an elongate strip or layer of tape 44 is applied to the top surface of the leadframe 12. More particularly, as shown in FIG. 3A, the tape 44 is applied to the top surface of the leadframe 12 such that the top surfaces of the contacts 22 and the top surfaces of the tie bars 27 are completely covered by the tape 44, with portions of the top surfaces of the traces 24 and a portion of the top surface of the lateral side 18 to which the tie bars 27 are connected being partially covered by the tape 44. As further seen in FIG. 3A, the tape 44 also extends to and covers portions of the top surfaces of the longitudinal sides 16 of the dambar 14.

Subsequent to the application of the tape 44 to the leadframe 12 in the manner shown in FIG. 3A, a singulation (e.g., a punching) operation is completed which effectively facilitates the removal of the tie bars 27 from the leadframe 12. More particularly, the tie bars 27 are punched-out through the tape 44, thus effectively separating the contacts 22 from the dambar 14, and electrically isolating the contacts 22 from each other. Subsequent to the completion of the punching operation, the semiconductor die(s) 30 and/or other devices are secured to the top surface of the die pad 20 and electrically connected thereto and/or to the traces 24 through the use of the conductive wires 32. Those of ordinary skill in the art will recognize that the application of the tape 44 to the leadframe 12 and removal of the tie bars 27 could occur subsequent to the attachment and electrical connection of the semiconductor die(s) 30 and/or other devices to the leadframe 12.

After the semiconductor die(s) 30 and/or other devices have been attached and electrically connected to the leadframe 12, and the tie bars 27 have been removed in the above-described manner, an encapsulant material is applied to the leadframe 12, the semiconductor die(s) 30, and conductive wires 32. The encapsulant is further applied to the portion of the tape 44 remaining subsequent to the removal of the tie bars 27 by the punching operation. The encapsulant material is preferably a plastic (e.g., thermoset, thermoplastic) which, upon hardening, forms a body 34 of the memory card 10. The body 34 is formed to provide a prescribed form factor for the memory card 10. The body 34 defines a generally planar top surface 35, and an opposed, generally planar bottom surface 36. In addition, the body 34 defines an opposed pair of longitudinal sides 38, an opposed pair of lateral sides 40, and a fifth sloped side 42 which extends angularly between one of the lateral sides 40 and one of the longitudinal sides 38. In the completed body 34, the bottom surfaces of the contacts 22 of the leadframe 12 are exposed in and generally flush with the bottom surface 36 of the body 34. Additionally, the tape 44 is embedded within the body 34 in the manner best shown in FIG. 4. In the fully formed memory card 10, one edge of the tape 44 extends to and is thus exposed in the leading edge or side 40 of the body 34, i.e., the side 40 adjacent to and extending along the contacts 22. It is contemplated that, as an alternative to the tape 44, a layer of epoxy may be applied to the leadframe 12 in a manner covering those portions thereof described above as being covered by the tape 44. The hardening of the epoxy creates a layer which provides the same functional attributes as the tape 44.

The fabrication of the memory card 10 through the application of the tape 44 or epoxy layer to the leadframe 12 provides significant advantages over currently known fabrication techniques. In accordance with such techniques, the body 34 would be formed on the leadframe 12 such that the dambar 14 and portions of the tie bars 26, 27 remain exposed (i.e., are not covered by the body 34). The exposure of the dambar 14 and portions of the tie bars 26, 27 allows for the removal of the same from the completely formed body 34. In this regard, subsequent to the formation of the body 34, the leaframe 12 would be cut or singulated in a manner facilitating the removal of the dambar 14 as is needed to electrically isolate the traces 24 and hence the contacts 22 from each other. However, as indicated above, the severing of the tie bars 27 result in the severed distal ends thereof still being exposed in the leading edge of the body 34. Such exposure gives rise to potential occurrences of shorting against the metal features of the host socket.

Figure 5A:
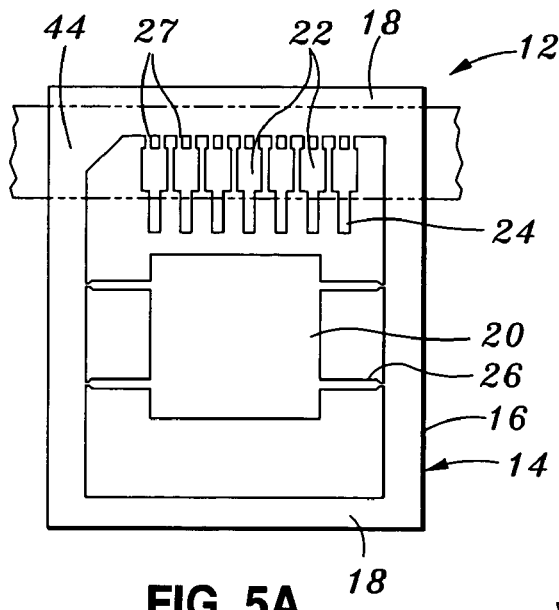
FIGS. 5A and 5B are bottom plan views of the leadframe of the memory card illustrating an exemplary sequence of steps which may be used to facilitate the application of the tape thereto and the singulation of the tie bars thereof in accordance with a second embodiment of the present invention.
Figure 5B:
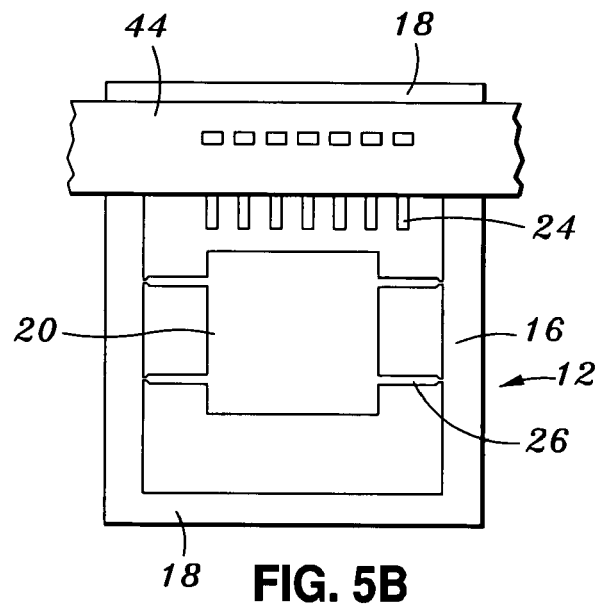
Figure 6:
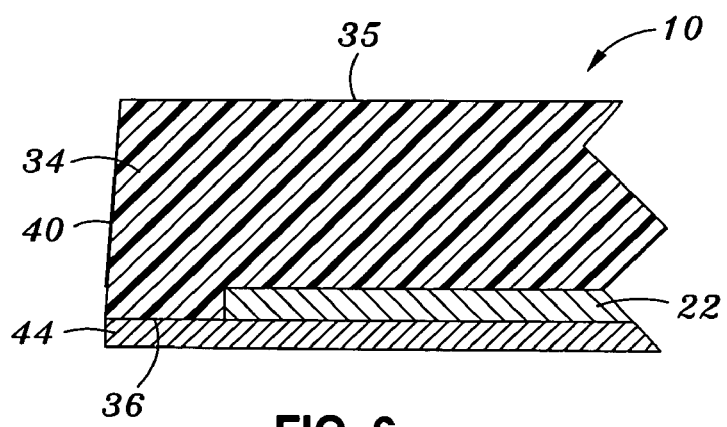
FIG. 6 is a partial cross-sectional view of a memory card formed through the implementation of the fabrication steps shown in FIGS. 5A and 5B.

Referring now to FIGS. 5A, 5B and 6, in accordance with a second embodiment of the present invention, the memory card 10 is fabricated by essentially the same process described above in relation to FIGS. 3A, 3B and 4, except that the tape 44 is applied to the bottom surface of the leadframe 12, rather than to the top surface thereof as described in relation to the first embodiment. More particularly, as shown in FIG. 5A, the tape 44 is applied to the bottom surface of the leadframe 12 such that the bottom surfaces of the contacts 22 and the bottom surfaces of the tie bars 27 are completely covered by the tape 44, with portions of the bottom surfaces of the traces 24 and a portion of the bottom surface of the lateral side 18 to which the tie bars 27 are connected being partially covered by the tape 44. The tape 44 also extends to and covers portions of the bottom surfaces of the longitudinal sides 16 of the dambar 14. In the event the traces 24 of the leaframe 12 are optionally "upset" (i.e., perpendicularly recessed or offset relative to the bottom surfaces of the contacts 22), the tape 44 will not cover the bottom surfaces of the traces 24, but rather will be spaced therefrom.

Figure 11:
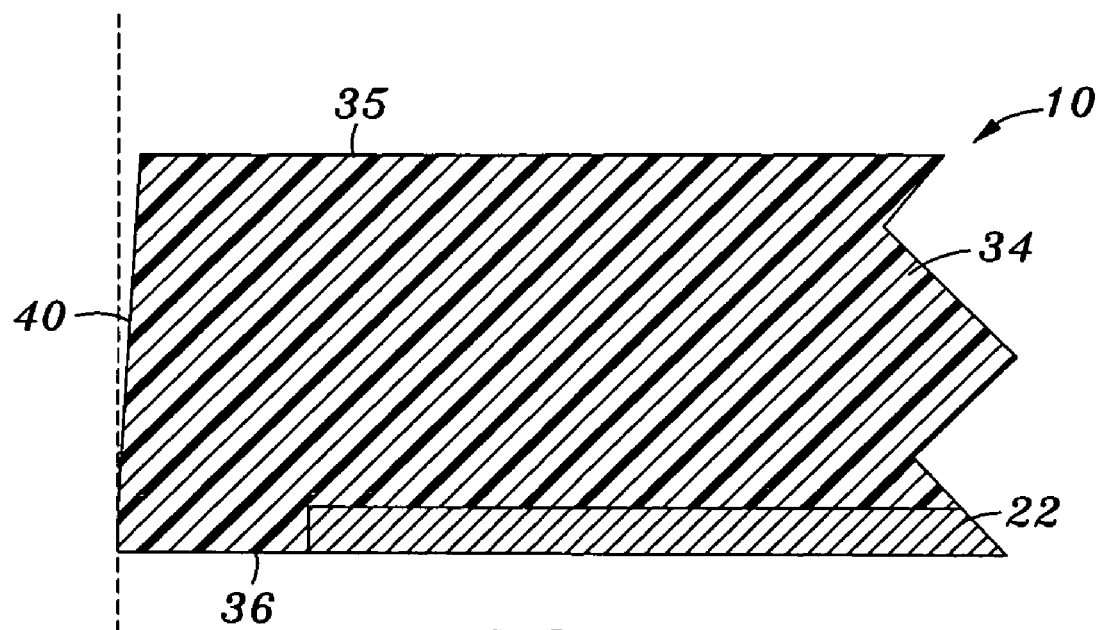
FIG. 11 is a partial cross-sectional view of the memory cards shown in FIGS. 6, and 10 subsequent to the removal of the tape from the ESC pads thereof.

Subsequent to the application of the tape 44 to the leadframe 12 in the manner shown in FIG. 5A, the above-described punching operation is completed to effectively facilitate the removal of the tie bars 27 from the leadframe 12 in the manner shown in FIG. 5B. After the semiconductor die(s) 30 and/or other devices have been attached and electrically connected to the leadframe 12, and the tie bars 27 have been removed therefrom, the body 34 of the memory card 10 is formed in the above-described manner. As seen in FIG. 6, due to the application of the tape 44 to the bottom surface of the leadframe 12, in the fully formed memory card 10, the tape 44 is not embedded within the body 34, but rather simply extends over the bottom surfaces of the contacts 22 and a portion of the bottom surface 36 of the body 34. Thus, subsequent to the formation of the body 34, the tape 44 may be completely removed, thus causing the memory card 10 to have the cross-sectional configuration shown in FIG. 11, the tape 44 not constituting part of the complete memory card 10.

Figure 7A:
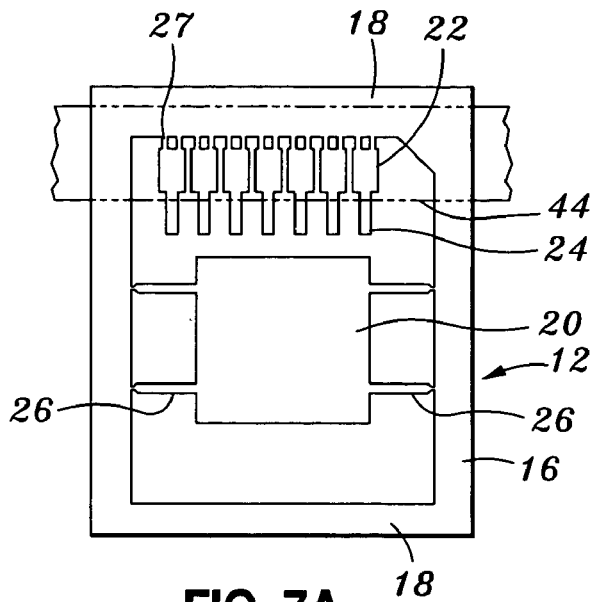
FIGS. 7A and 7B are top plan views of the leadframe of the memory card illustrating an exemplary sequence of steps which may be used to facilitate the application of tape thereto and the singulation of the tie bars thereof in accordance with a third embodiment of the present invention.
Figure 7B:
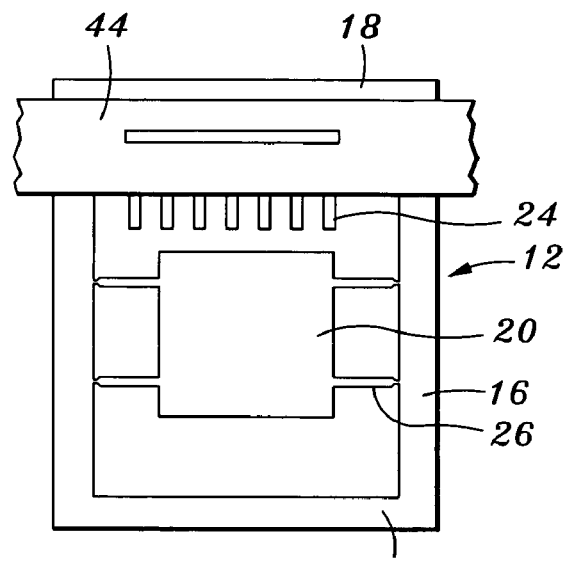
Figure 8:
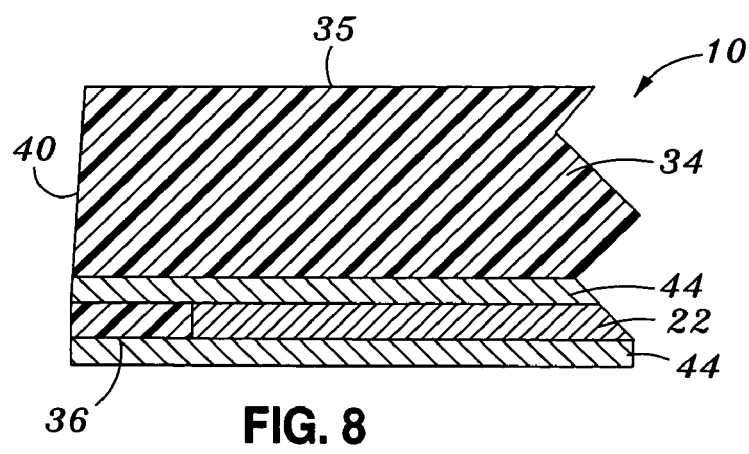
FIG. 8 is a partial cross-sectional view of a memory card formed through the implementation of the fabrication steps shown in FIGS. 7A and 7B.

Referring now to FIGS. 7A, 7B and 8, in accordance with the third embodiment of the present invention, the memory card 10 is fabricated by essentially the same process described above in relation to FIGS. 3A, 3B and 4, except that the tape 44 is applied to both the top and bottom surfaces of the leadframe 12, rather than only to the top surface thereof as described in relation to the first embodiment, or only to the bottom surface thereof as described in relation to the second embodiment. More particularly, as shown in FIG. 7A, the tape 44 is applied to both the top and bottom surfaces of the leadframe 12 such that the top and bottom surfaces of the contacts 22 and the top and bottom surfaces of the tie bars 27 are completely covered by respective layers of the tape 44. Portions of the top and bottom surfaces of the traces 24 and portions of the top and bottom surfaces of the lateral side 18 to which the tie bars 27 are connected are partially covered by respective layers of the tape 44. The layers of tape 44 also extend to and cover portions of the top and bottom surfaces of the longitudinal sides 16 of the dambar 14.

Subsequent to the application of the layers of tape 44 to respective top and bottom surfaces of the leadframe 12 in the manner shown in FIG. 5A, the above-described punching operation is completed to effectively facilitate the removal of the tie bars 27 from the leadframe 12 in the manner shown in FIG. 7B. When the layers of tape 44 are applied to both the top and bottom surfaces of the leadframe 12, the punching operation is completed in a manner wherein a single, elongate slot is formed through the layers of tape 44 as is shown in FIG. 7B. This is in contrast to the type of punching operation which occurs in relation to the first and second embodiments wherein the completion of the punching operation facilitates the formation of a series of small, linearly aligned openings in either the top layer of tape 44 (in the case of the first embodiment as shown in FIG. 3B) or in the bottom layer of tape 44 (in the case of the second embodiment as shown in FIG. 5B).

After the semiconductor die(s) 30 and/or other devices have been attached and electrically connected to the leadframe 12, and the tie bars 27 have been removed therefrom, the body 34 of the memory card 10 in the third embodiment is formed in the same manner described above in relation to the first and second embodiments. As seen in FIG. 8, due to the application of the layers of tape 44 to the top and bottom surfaces of the leadframe 12, in the fully formed memory card 10, the layer of tape 44 applied to the top surface of the leadframe 12 is embedded within the body 34, with one edge thereof extending to and thus being exposed in the leading edge or side 40 of the body 34. The layer of tape 44 attached to the bottom surface of the leadframe 12 is not embedded within the body 34 of the fully formed memory card 10, but rather simply extends over the bottom surfaces of the contacts 22 and a portion of the bottom surface 36 of the body 34. Thus, subsequent to the formation of the body 34, this bottom layer of tape 44 may be completely removed, thus causing the memory card 10 to have the cross-sectional configuration shown in FIG. 4.

Figure 9A:
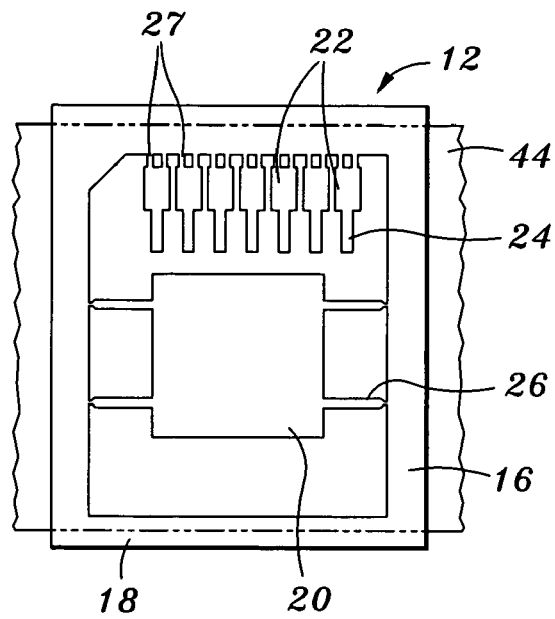
FIGS. 9A and 9B are top plan views of the leadframe of the memory card illustrating an exemplary sequence of steps which may be used to facilitate the application of tape thereto and the singulation of the tie bars thereof in accordance with a fourth embodiment of the present invention.
Figure 9B:
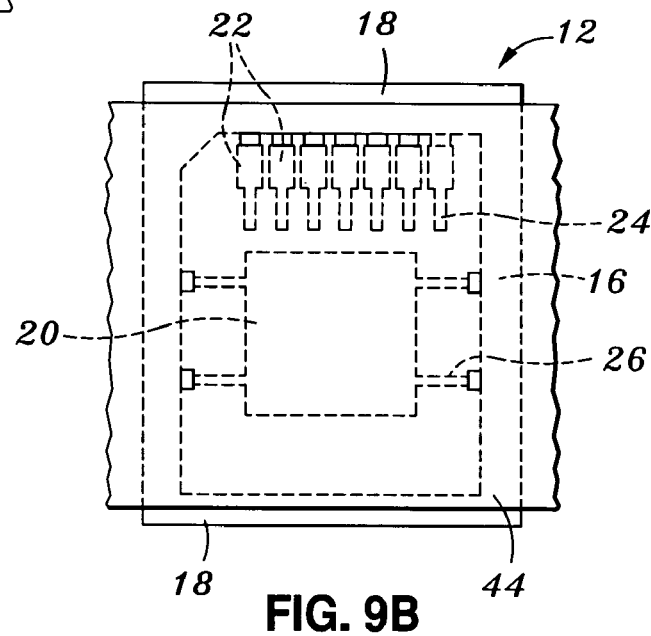
Figure 10:
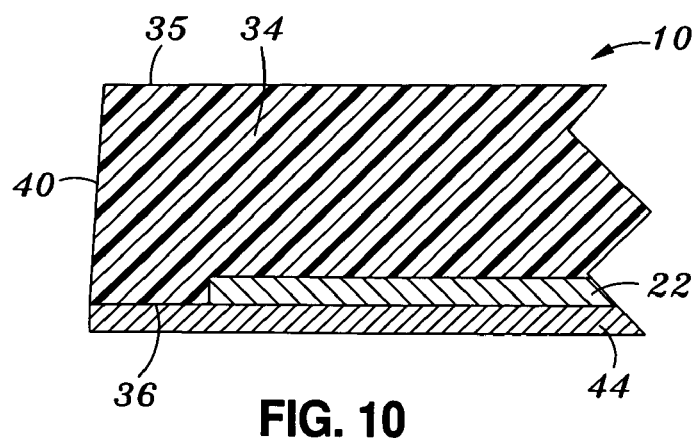
FIG. 10 is a partial cross-sectional view of a memory card formed through the implementation of the fabrication steps shown in FIGS. 9A and 9B.

Referring now to FIGS. 9A, 9B and 10, in accordance with a fourth embodiment of the present invention, the memory card 10 is fabricated by essentially the same process described above in relation to FIGS. 5A, 5B and 6, except that the width of the layer of tape 44 applied to the bottom surface of the leadframe 12 in the fourth embodiment substantially exceeds that of the tape 44 applied to the bottom surface of the leadframe 12 in the second embodiment. More particularly, as shown in FIG. 9A, the tape 44 is applied to the bottom surface of the leadframe 12 such that the bottom surfaces of the contacts 22, the bottom surfaces of the traces 24, the bottom surfaces of the tie bars 26, 27, and the bottom surface of the die pad 20 are completely covered by the tape 44. The tape 44 also extends to and covers at least portions of the bottom surfaces of the longitudinal and lateral sides 16, 18 of the dambar 14. However, the tape 44 may be spaced from the bottom surfaces of the traces 24 and the tie bars 26, 27 in the event the leadframe 12 is optionally subjected to a half-etching process wherever the bottom surfaces of the traces 24 and tie bars 26, 27 are perpendicularly recessed relative to the bottom surfaces of the die pad 20 and contacts 22.

Subsequent to the application of the tape 44 to the leadframe 12 in the manner shown in FIG. 9A, the above-described punching operation is completed to effectively facilitate the removal of the tie bars 27 from the leadframe 12 in the manner shown in FIG. 9B. After the semiconductor die(s) 30 and/or other devices have been attached and electrically connected to the leadframe 12, and the tie bars 27 have been removed therefrom, the body 34 of the memory card 10 is formed in the above-described manner. As seen in FIG. 10, due to the application of the tape 44 to the bottom surface of the leadframe 12, in the fully formed memory card 10, the tape 44 is not embedded in the body 34, but rather simply extends over the entire bottom surface 36 of the body 34, including the bottom surfaces of the contacts 22. Thus, subsequent to the formation of the body 34, the tape 44 may be completely removed, thus causing the memory card 10 to have the cross-sectional configuration shown in FIG. 11 wherein the tape 44 does not constitute part of the complete memory card 10.

Those of ordinary skill in the art will recognize that in each of the above-described embodiments of the present invention, the layer(s) of tape 44 may be substituted with epoxy in the manner described in relation to the first embodiment. Additionally, in any embodiment of the present invention, the punching operation may be completed so as to facilitate the formation of the series of openings as shown in FIGS. 3B, 5B, and 9B, or the single elongate slot as shown in FIG. 7B. As will be recognized, the openings or slot created as a result of the punching operation must be sized and configured as necessary to ensure the complete removal of all of the tie bars 27 extending between the contacts 22 and the dambar 14. Additionally, though a punching operation is the preferred method to facilitate the removal of the tie bars 27 from the leadframe 12, those of ordinary skill in the art will recognize that removal methods other for a punching operation are contemplated to be within the spirit and scope of the present invention. In each embodiment of the present invention, the complete removal of the tie bars 27 made possible by the inclusion of the layer(s) of tape 44 applied to the leadframe 12 provides the advantages specifically discussed in relation to the first embodiment.

Figure 12A:
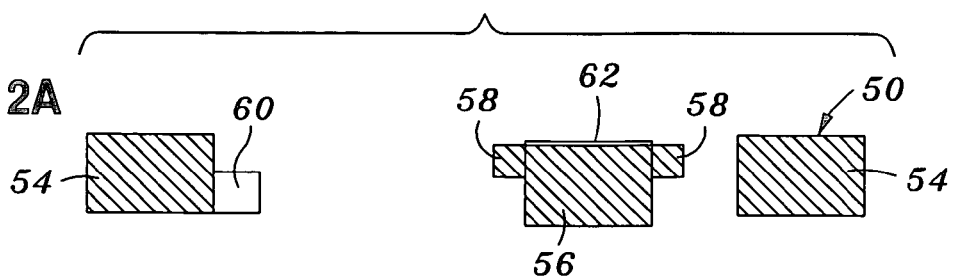
FIGS. 12A–12E illustrate an exemplary sequence of steps which may be used to facilitate fabrication of a memory card in accordance with a fifth embodiment of the present invention.
Figure 12B:
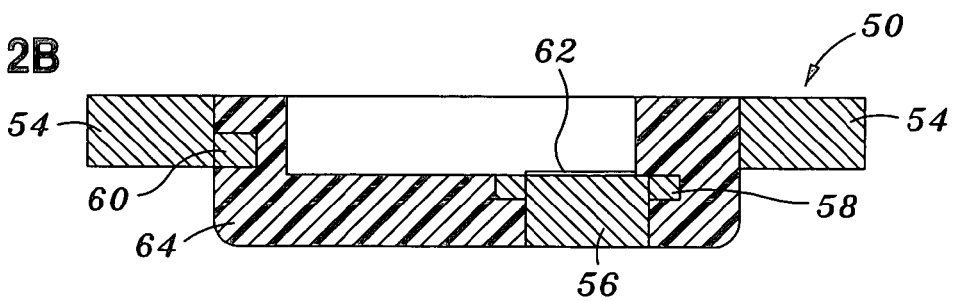
Figure 12C:
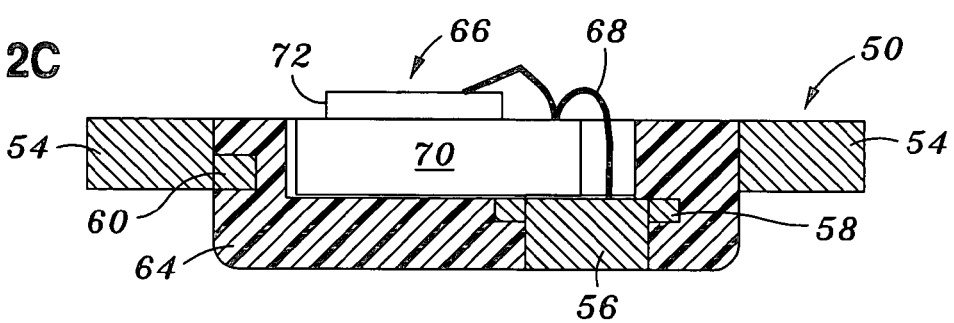
Figure 12D:
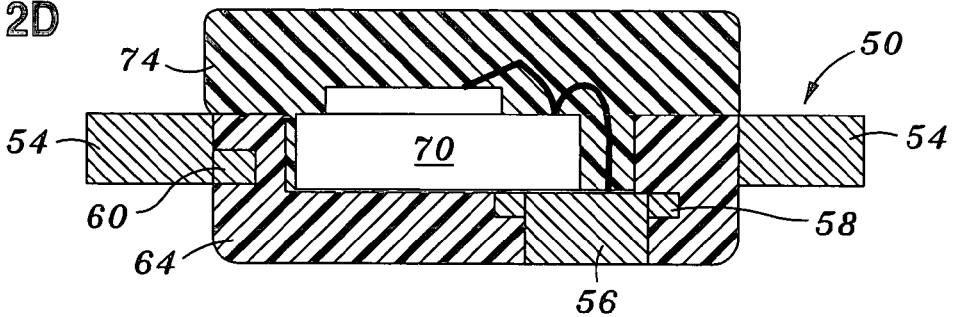
Figure 12E:
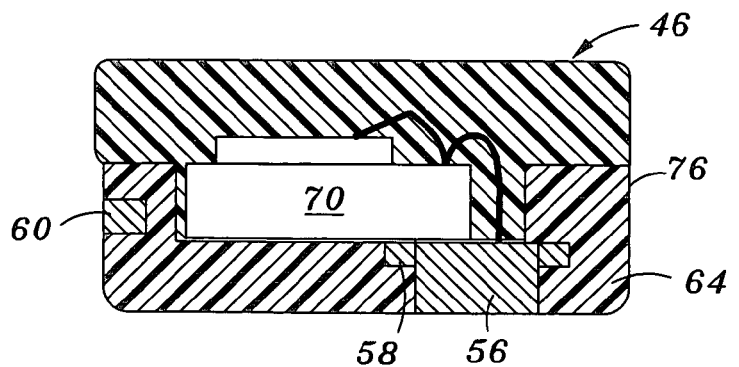
Figure 13:
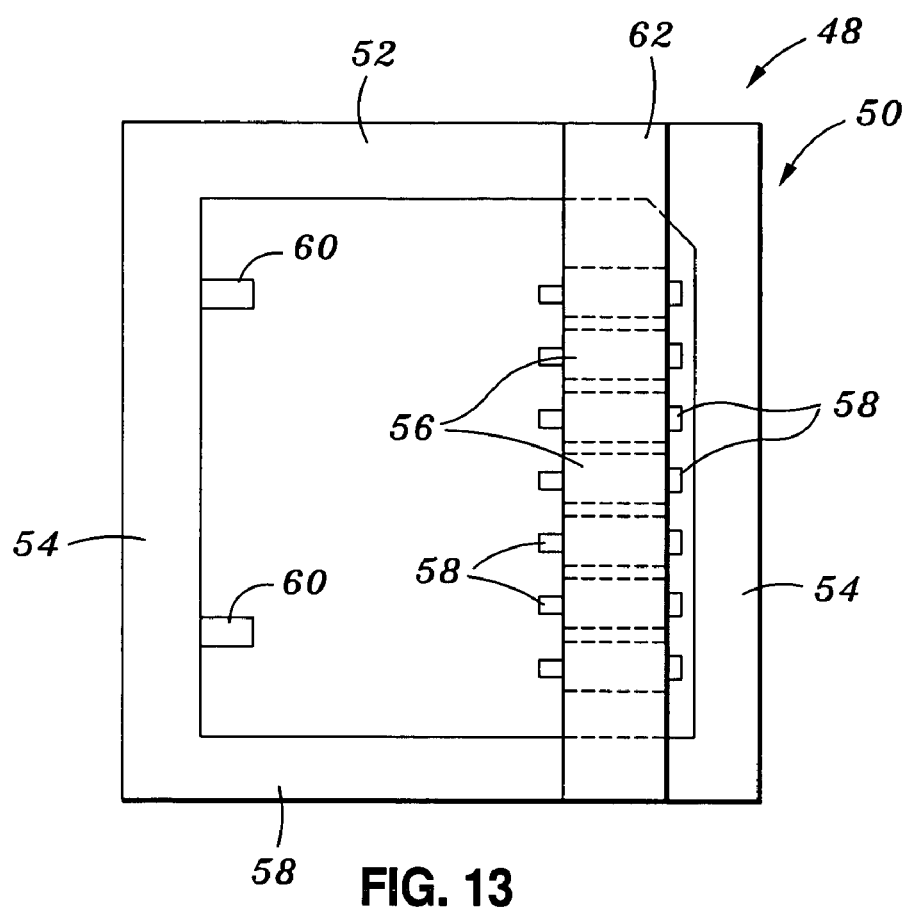
FIG. 13 is a top plan view of the leadframe of the memory card having tape applied thereto in accordance with the fifth embodiment, the side elevational view of which is shown in FIG. 12A.

Referring now to FIGS. 12A–12E and 13, there is depicted an exemplary sequence of steps which may be used to facilitate the fabrication of a memory card 46 (shown in FIG. 12E) in accordance with a fifth embodiment of the present invention. As seen in FIG. 13, the memory card 46 comprises a leadframe 48 having an outer frame or dambar

50. Dambar 50 has a generally quadrangular configuration defining an opposed pair of longitudinal sides or segments 52 and an opposed pair of lateral sides or segments 54. Disposed within the interior of the dambar 50 is a plurality of contacts 56 of the leadframe 48. The contacts 56 are linearly aligned and extend in spaced, generally parallel relation to one of the lateral sides 54 of the dambar 50. Protruding from each of the opposed lateral ends of each contact 56 is a locking tab 58. As such, each contact 56 includes a pair of locking tabs 58 extending from respective ones of the opposed ends thereof. As seen in FIG. 12A, the thickness of each contact 56 substantially exceeds the thickness of each of the locking tabs 58 of the pair protruding therefrom. Additionally, formed on and extending inwardly from the lateral side 54 of the dambar 50 opposite that along which the contacts 56 extend is a pair of locking tabs 60. Like the locking tabs 58, the locking tabs 60 are formed such that the thicknesses thereof are substantially less than that of the dambar 50, as is also seen in FIG. 12A. The use of the locking tabs 58, 60 will be described in more detail below.

In contrast to the above-described leadframe 12, the leadframe 48 used to fabricate the memory card 46 does not include a die pad. Nor are tie bars used to connect the contacts 56 of the leadframe 48 to the adjacent lateral side 54 of the dambar 50. Rather, to facilitate the fabrication of the memory card 46, the contacts 56 are maintained in prescribed orientations relative to each other and to the dambar 50 via an elongate layer or strip of tape 62. In this regard, as seen in FIGS. 12A and 13, in the initial step of fabricating the memory card 46, the tape 62 is applied to the top surface of the leadframe 48 such that the top surfaces of the contacts 56 and portions of the longitudinal sides 52 of the dambar 50 are covered by the tape 62.

Subsequent to the application of the tape 62 to the leadframe 48 in the above-described manner, a first molding process is completed to facilitate the fabrication of a lower body section 64 of the memory card 46 (FIG. 12B). During this initial molding process, downward pressure is applied to the tape 62 and hence to the contacts 56 in a manner which causes the contacts 56 to be vertically downset or recessed relative to the dambar 50 in the manner shown in FIG. 12B. Importantly, the tape 62 has sufficient pliability so as to allow for such downsetting of the contacts 56, despite the opposed ends portions of the tape 62 being maintained in engagement to the longitudinal sides 52 of the dambar 50. The formation of the lower body section 64 occurrs subsequent to such downsetting of the contacts 56. As further seen in FIG. 12B, the contacts 56 are effectively mechanically interlocked to the lower body section 64 as a result of the flow of the encapsulant material which ultimately hardens into the lower body section 64 about the locking tabs 58 of each contact 56. Similarly, the encapsulant material which ultimately hardens into the lower body section 64 also flows about the locking tabs 60 protruding inwardly from one lateral side 54 of the dambar 50. Importantly, the lower body section 64 is formed to have a radiused edge which extends around the entire perimeter of the generally planar bottom surface thereof. The generally planar bottom surfaces of the contacts 56 are also exposed in and substantially flush with the bottom surface of the lower body section 64.

Subsequent to the formation of the lower body section 64, an electronic component 66 is mounted within a cavity defined by the lower body section 64, and electrically connected to the top surface of at least one of the contacts 56 by a conductive wire 68 (FIG. 12C). As seen in FIG. 12C, the electronic component comprises a laminate substrate 70 having a semiconductor die 72 which is mounted to the top surface thereof and electrically connected thereto, the substrate 70 in turn being electrically connected to one or more of the contacts 56 by one or more wires 68. Since it is contemplated that the tape 62 will not be removed from the top surfaces of the contacts 56, it will be recognized that portions of the tape will need to be removed as necessary to allow for the advancement of the wire(s) 68 to the top surface(s) of the contact(s) 56. However, it is further contemplated that the tape 62 may be completely removed from the top surfaces of the contacts 56 subsequent to the formation of the lower body section 64. Those of ordinary skill in the art will further appreciate that the electronic component 66 shown and described in relation to FIG. 12C is exemplary only, in that one or more semiconductor dies and/or one or more other devices, mounted or not mounted to a laminate substrate, may be placed into the cavity of the lower body section 64 and electrically connected to the contact(s) 56 with or without the use of the conductive wire(s) 68.

Subsequent to the mounting of the electronic component 66 to the lower body section 64 and electrical connection of the electronic component 66 to the contact(s) 56, a second molding operation is completed to facilitate the formation of an upper body section 74 upon the lower body section 64 (FIG. 12D). The lower body section 74 fills the open areas of the cavity defined by the lower body section 64, and completely covers or encapsulates the electronic component 66 and the wire(s) 68 (if any) used to electrically connect the electronic component 66 to the contacts 56. Like the lower body section 64, the upper body section 74 is preferably molded such that a radiused edge extends about the entire perimeter of the generally planar top surface of the upper body section 74. Subsequent to the formation of the upper body section 74, a singulation process is completed to facilitate the removal of the dambar 50 from the remainder of the leadframe 48 (FIG. 12E). The removal of the dambar 50 effectively completes the fabrication of the memory card 46. The fully formed memory card 46 has a body which is collectively defined by the lower and upper body sections 64, 74 described above. Due to the complete absence of any tie bars in the leadframe 48, the leading edge or side 76 of the body of the memory card 46 does not have any tie bar ends exposed therein.

Figure 14:
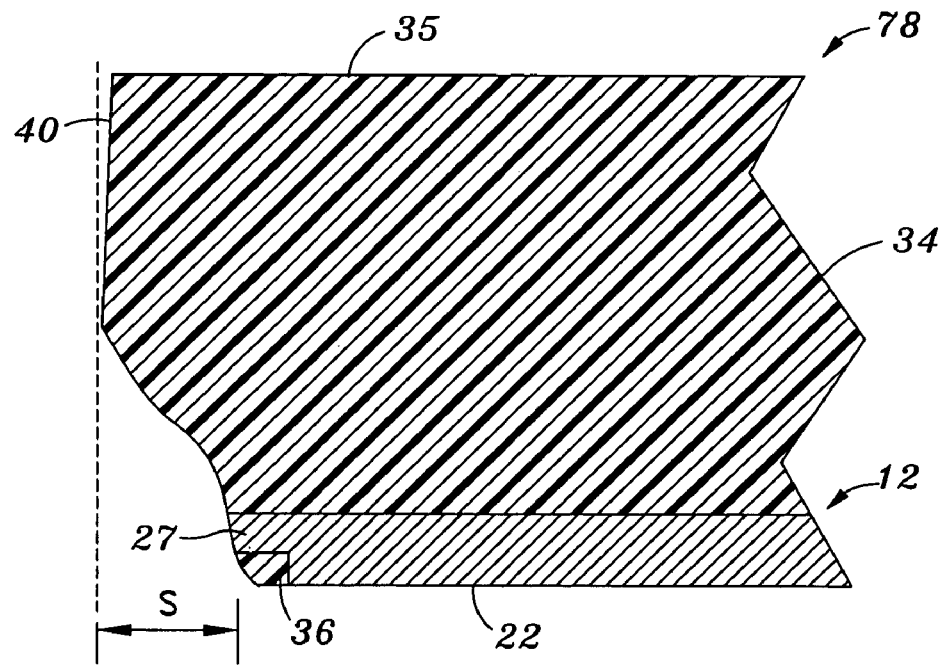
FIG. 14 is a partial cross-sectional view of a memory card formed in accordance with a sixth embodiment of the present invention.

Referring now to FIG. 14, there is shown a partial cross-section of a memory card 78 formed in accordance with a sixth embodiment of the present invention. The memory card 78 includes the above-described leadframe 12. However, in the process of fabricating the memory card 78, no layer of tape is applied to either the top or bottom surfaces of the leadframe 12. Rather, after the semiconductor die(s) 30 and/or other devices have been attached and electrically connected to the leadframe 12, the body 34 is formed on the leadframe 12 in the above-described manner. Since, in the initial steps of the fabrication process for the memory card 78, the tie bars 27 are not punched or otherwise removed from the leadframe 12, upon the formation of the body 34 and singulation of the dambar 14 from the remainder of the leadframe 12, the severed distal ends of the tie bars 27 will be exposed in the leading edge or side 40 of the body 34, i.e., the side 40 adjacent to and extending along the contacts 22.

In accordance with the sixth embodiment of the present invention, a milling or etching process is conducted upon the lower peripheral edge or corner of the leading side 40 of the body 34, this milling or etching procedure imparting a contoured profile to a portion of such leading side 40 in the manner shown in FIG. 14. Due to such contoured profile, the distal ends of the tie bars 27 are exposed only in the contoured portion of the leading side 40, and thus are recessed relative that portion of the side 40 which is unaffected by the milling or etching procedure. Thus, the contoured portion of the leading side 40 of the body 34 creates a safety margin S as shown in FIG. 14 wherein the exposed ends of the tie bars 27 are substantially prevented from making contact with the metal features of the host socket.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method of fabricating a memory card, comprising the steps of:
    a) providing a leadframe having:
        a dambar having opposed top and bottom dambar surfaces; and
        a plurality of contacts defining opposed top and bottom contact surfaces, each of the contacts being attached to the dambar by at least one tie bar which defines opposed top and bottom tie bar surfaces;
    b) applying at least one layer of tape to the leadframe such that the tape covers the top contact surfaces of the contacts, the top tie bar surfaces of the tie bars, and at least a portion of the top dambar surface of the dambar;
    c) removing the tie bars from the leadframe;
    d) electrically connecting at least one semiconductor die to the leadframe; and
    e) forming a body on the leadframe such that the semiconductor die and the tape are covered by the body and at least portions of the bottom contact surfaces of the contacts are exposed in an exterior surface thereof.

2. The method of claim 1 wherein step (c) comprises removing the tie bars from the leadframe through a punching operation which punches through at least a portion of the tape.

3. The method of claim 1 wherein:
    step (a) comprises providing a leadframe having a die pad which defines opposed top and bottom die pad surfaces and is attached to the dambar;
    step (d) comprises attaching the semiconductor die to the top die pad surface of the die pad; and
    step (e) comprises forming the body to at least partially cover the die pad.

4. The method of claim 3 wherein:
    step (a) comprises providing a leadframe having a plurality of conductive traces which each define opposed top and bottom trace surfaces and extend from respective ones of the contacts toward the die pad;
    step (b) comprises applying the tape to the leadframe such that the tape extends over at least a portion of the top trace surface of each of the conductive traces;
    step (d) comprises electrically connecting the semiconductor die to at least one of the conductive traces; and
    step (e) comprises forming the body such that the conductive traces are covered thereby.

5. The method of claim 1 wherein:
    step (a) comprises providing a leadframe wherein the bottom contact surfaces of contacts are each generally planar; and
    step (e) comprises forming the body such that the exterior surface thereof is generally planar and the bottom contact surfaces of the contacts are exposed in and substantially flush with the exterior surface.

6. The method of claim 1, further comprising the step of:
    f) removing the dambar from the leadframe.

7. A method of fabricating a memory card, comprising the steps of:
    a) providing a leadframe having:
        a dambar having opposed top and bottom dambar surfaces; and
        a plurality of contacts defining opposed top and bottom contact surfaces, each of the contacts being attached to the dambar by at least one tie bar which defines opposed top and bottom tie bar surfaces;
    b) applying a layer of tape to the leadframe such that the tape covers one of the top and bottom contact surfaces of the contacts, one of the top and bottom tie bar surfaces of the tie bars, and at least a portion of one of the top and bottom dambar surface of the dambar;
    c) removing the tie bars from the leadframe;
    d) electrically connecting at least one semiconductor die to the leadframe; and
    e) forming a body on the leadframe such that the semiconductor die is covered by the body and at least portions of the bottom contact surfaces of the contacts are exposed in an exterior surface thereof.

8. The method of claim 7 further comprising the step of:
    f) removing the dambar from the leadframe.

9. The method of claim 7 wherein step (c) comprises removing the tie bars from the leadframe through a punching operation which punches through at least a portion of the tape.

10. The method of claim 7 wherein:
    step (a) comprises providing a leadframe having a die pad which defines opposed top and bottom die pad surfaces and is attached to the dambar; and
    step (d) comprises attaching the semiconductor die to the top die pad surface of the die pad; and
    step (e) comprises forming the body to at least partially cover the die pad.

11. The method of claim 10 wherein:
    step (a) comprises providing a leadframe having a plurality of conductive traces which each define opposed top and bottom trace surfaces and extend from respective ones of the contacts toward the die pad;
    step (b) comprises applying the tape to the leadframe such that the tape extends over at least a portion of one of the top and bottom trace surface of each of the conductive traces;
    step (d) comprises electrically connecting the semiconductor die to at least one of the conductive traces; and
    step (e) comprises forming the body such that the conductive traces are covered thereby.

12. The method of claim 7 wherein:
    step (a) comprises providing a leadframe wherein the bottom surfaces of contacts are each generally planar; and
    step (e) comprises forming the body such that the exterior surface thereof is generally planar and the bottom surfaces of the contacts are exposed in and substantially flush with the exterior surface.

13. A method of fabricating a memory card, comprising the steps of:
    a) providing a leadframe having:
        a dambar having opposed top and bottom dambar surfaces; and
        a plurality of contacts defining opposed top and bottom contact surfaces, each of the contacts being attached to the dambar by at least one tie bar which defines opposed top and bottom tie bar surfaces;

b) applying a support means to the leadframe such that the support means covers the top contact surfaces of the contacts, the top tie bar surfaces of the tie bars, and at least a portion of the top dambar surface of the dambar;

c) removing the tie bars from the leadframe;

d) electrically connecting at least one semiconductor die to the leadframe; and e) forming a body on the leadframe such that the semiconductor die and the support means are covered by the body and at least portions of the bottom contact surfaces of the contacts are exposed in an exterior surface thereof.

14. The method of claim 13 wherein step (c) comprises removing the tie bars from the leadframe through a punching operation which punches through at least a portion of the support means.

15. The method of claim 13 wherein:

step (a) comprises providing a leadframe having a die pad which defines opposed top and bottom die pad surfaces and is attached to the dambar;

step (d) comprises attaching the semiconductor die to the top die pad surface of the die pad; and step (e) comprises forming the body to at least partially cover the die pad.

* * * * *